United States Patent
Akiyama et al.

(10) Patent No.: US 10,431,460 B2
(45) Date of Patent: Oct. 1, 2019

(54) METHOD FOR PRODUCING SIC COMPOSITE SUBSTRATE

(71) Applicants: Shin-Etsu Chemical Co., Ltd., Tokyo (JP); CUSIC Inc., Sendai-shi, Miyagi (JP)

(72) Inventors: Shoji Akiyama, Annaka (JP); Yoshihiro Kubota, Annaka (JP); Hiroyuki Nagasawa, Sendai (JP)

(73) Assignees: SHIN-ETSU CHEMICAL CO., LTD., Tokyo (JP); CUSIC INC., Sendai-shi, Miyagi (JP)

( * ) Notice: Subject to any disclaimer, the term of this patent is extended or adjusted under 35 U.S.C. 154(b) by 9 days.

(21) Appl. No.: 15/759,578
(22) PCT Filed: Sep. 9, 2016
(86) PCT No.: PCT/JP2016/076537
§ 371 (c)(1),
(2) Date: Mar. 13, 2018
(87) PCT Pub. No.: WO2017/047508
PCT Pub. Date: Mar. 23, 2017

(65) Prior Publication Data
US 2019/0157087 A1 May 23, 2019

(30) Foreign Application Priority Data
Sep. 15, 2015 (JP) ................. 2015-181908

(51) Int. Cl.
H01L 21/20 (2006.01)
H01L 21/02 (2006.01)
H01L 21/04 (2006.01)

(52) U.S. Cl.
CPC .... *H01L 21/2011* (2013.01); *H01L 21/02381* (2013.01); *H01L 21/0445* (2013.01); *H01L 21/2022* (2013.01)

(58) Field of Classification Search
None
See application file for complete search history.

(56) References Cited

U.S. PATENT DOCUMENTS

| 6,964,914 B2 | 11/2005 | Ghyselen et al. |
| 2009/0321747 A1* | 12/2009 | Murphy ............ H01L 21/76254 257/77 |
| 2016/0204023 A1 | 7/2016 | Imaoka et al. |
| 2018/0047630 A1* | 2/2018 | Kato .................... B23K 26/57 |

FOREIGN PATENT DOCUMENTS

| JP | 2002-280531 A | 9/2002 |
| JP | 2011-222607 A | 11/2011 |
| JP | 5051962 B2 | 10/2012 |
| JP | 2015-15401 A | 1/2015 |

OTHER PUBLICATIONS

International Search Report dated Dec. 6, 2016, issued in counterpart International Application No. PCT/JP2016/076537 (1 page).

* cited by examiner

*Primary Examiner* — Bradley Smith
(74) *Attorney, Agent, or Firm* — Westerman, Hattori, Daniels & Adrian, LLP

(57) ABSTRACT

A method for producing a SiC composite substrate 10 having a single crystal SiC layer 12 on a polycrystalline SiC substrate 11. After the single crystal SiC layer 12 is provided on the front surface of a holding substrate 21 including Si and having a silicon oxide film 21a on the front and back surfaces thereof to produce a single crystal SiC layer supporting body 14, a part or all of the thickness of the silicon oxide film 21a on one area or all of the back surface of the holding substrate 21 in the single crystal SiC layer supporting body 14 is removed to impart warpage to the single crystal SiC layer supporting body 14'. Then, polycrystalline SiC is deposited on the single crystal SiC layer 12 by chemical vapor deposition to form the polycrystalline SiC substrate 11, and the holding substrate is physically and/or chemically removed.

15 Claims, 2 Drawing Sheets

METHOD FOR PRODUCING SIC COMPOSITE SUBSTRATE

TECHNICAL FIELD

The present invention relates to a method for producing a silicon carbide (SiC) composite substrate having a monocrystalline SiC layer on a polycrystalline SiC substrate, which composite substrate can be used in the fabrication of power semiconductor devices, such as Schottky barrier diodes, pn diodes, pin diodes, field effect transistors and insulated gate bipolar transistors (IGBT), utilized for power control at high temperatures, frequencies and power levels, and in the growth of gallium nitride, diamond and nanocarbon thin films.

BACKGROUND ART

Monocrystalline silicon substrates are widely used today as substrates for semiconductors. However, their characteristics do not always make them suitable for recent trends toward higher withstand voltages and higher frequencies. Hence, although expensive, use is starting to be made of monocrystalline SiC and monocrystalline GaN substrates. For example, by employing semiconductor devices made with silicon carbide (SiC), which is a semiconductor material having a greater forbidden bandwidth than silicon (Si), to build power converters such as inverters and AC/DC converters, a reduction in power loss unattainable with semiconductor devices that use silicon has been achieved. Compared with earlier art, the use of SiC-based semiconductor devices reduces loss associated with power conversion and promotes a lighter weight, smaller size and high reliability in the power converter. Monocrystalline SiC substrates are also under investigation as starting materials for nanocarbon thin-films (including graphene) as a next-generation device material.

Typical methods for producing such monocrystalline SiC substrates and monocrystalline GaN substrates are as follows. (1) Monocrystalline SiC substrates are produced using an SiC sublimation process that grows seed crystals while sublimating SiC by subjecting a high-purity SiC powder to an elevated temperature of at least 2,000° C. (2) Monocrystalline GaN substrates are produced by a process that grows GaN seed crystals within high-temperature, high-pressure ammonia or by additionally inducing the heteroepitaxial growth of GaN on a sapphire or monocrystalline SiC substrate. However, because these production processes are carried out under extremely exacting conditions and are complicated, the substrate quality and yield are inevitably low, resulting in very high-cost substrates, which is an impediment to their commercialization and widespread use.

The substrate thickness at which device functions actually manifest on these substrates is in each case between 0.5 and 100 μm. The remaining thickness portion carries out primarily a mechanical holding/protective function during substrate handling; that is, it serves primarily as a handle member (substrate).

Substrates wherein a monocrystalline SiC layer, for which the degree of thickness that allows handling is relatively thin, is bonded to a polyerystalline SiC substrate with an intervening ceramic such as $SiO_2$, $Al_2O_3$, $Zr_2O_3$, $Si_3N_4$ or AlN or an intervening metal such as silicon, titanium, nickel, copper, gold, silver, cobalt, zirconium, molybdenum or tin have been studied recently. However, when the intervening material for bonding the monocrystalline SiC layer and the polycrystalline SiC substrate is the former (a ceramic), the fact that this material is an insulator makes electrode production at the time of device fabrication difficult; when the intervening material is the latter (a metal), metallic impurities contaminate the device and tend to give rise to a deterioration in the device characteristics, which is impractical.

Various art for ameliorating these drawbacks has hitherto been described. For example, JP No. 5051962 (Patent Document 1) discloses a method which involves bonding together, at the silicon oxide faces, a source substrate which is a silicon oxide thin film-bearing monocrystalline SiC substrate that has been ion-implanted with hydrogen or the like with an intermediate support (handle substrate) of polycrystalline aluminum nitride having silicon oxide formed on the front side thereof, thereby transferring the monocrystalline SiC thin-film to the polycrystalline aluminum nitride (intermediate support), subsequently depositing thereon polycrystalline SiC and then placing the workpiece in a HF bath so as to dissolve and separate the silicon oxide faces. However, in general, because the silicon oxide faces are very closely and strongly bonded together, the HF does not readily penetrate over the entire surface of the silicon oxide faces, particularly the center portions thereof, as a result of which separation is not easy and takes an excessive amount of time, making for very poor productivity. Another problem is that, when fabricating a large-diameter SiC composite substrate using this invention, a large amount of warpage arises due to the difference between the coefficients of thermal expansion for the deposited layer of polycrystalline SiC and for the aluminum nitride (intermediate support).

JP-A 2015-15401 (Patent Document 2) discloses, for substrates whose surfaces are difficult to planarize, a method wherein a polycrystalline SiC-supporting substrate surface is amorphously modified, without oxide film formation, by means of a fast atomic beam and a monocrystalline SiC surface is also amorphously modified, following which both surfaces are brought into contact and thermal bonding is carried out, thereby stacking a monocrystalline SiC layer on a polycrystalline SiC-supporting substrate. However, in this method, the fast atomic beam alters not only the exfoliated interface of the monocrystalline SiC but also the crystal interior. As a result, this monocrystalline SiC, even with subsequent heat treatment, is not easily restored to good-quality monocrystalline SiC hence, when used in a device substrate, template or the like, obtaining a device having high characteristics or a good-quality SiC epitaxial film is difficult.

In addition to these drawbacks, in order to bond together the monocrystalline SiC with the polycrystalline SiC of the supporting substrate in the foregoing art, the bonding interface must have a smoothness corresponding to a surface roughness (arithmetic mean surface roughness Ra) of 1 nm or less. Yet, SiC is said to be the next most difficult-to-machine material after diamond. Even when a monocrystalline SiC surface is amorphously modified, subsequent smoothing processes such as grinding, polishing or chemical mechanical polishing (CMP) take an extremely long time, making higher costs unavoidable. Moreover, because polycrystalline materials have grain boundaries, carrying out fast atomic beam amorphization so as to achieve in-plane uniformity is difficult, leading to problems with the bonding strength and warpage, which has created major obstacles to commercialization.

PRIOR ART DOCUMENTS

Patent Documents

Patent Document 1: JP 5051962
Patent Document 2: JP-A 2015-15401

SUMMARY OF INVENTION

Technical Problem

As described above, major problems hindering the commercialization of SiC composite substrates exist in the prior art, including their high cost arising from the poor crystallinity of monocrystalline SiC and the complicated production process, and their inapplicability to precision semiconductor fabrication processes on account of large warpage of the SiC composite substrate.

The present invention was arrived at in light of the above circumstances. The object of this invention is to provide a method for producing SiC composite substrates that is simple and convenient and is capable of obtaining SiC composite substrates having a monocrystalline SiC layer of good crystallinity and little warpage.

Solution to Problem

In order to achieve this object, the invention provides the following method for producing SiC composite substrates.
[1] A method for producing a SiC composite substrate comprising a monocrystalline SiC layer on a polycrystalline SiC substrate, the method comprising the steps of, in order: providing a monocrystalline SiC layer on the front side of a support substrate, that is made of silicon and has a silicon oxide film on front and back sides thereof so as to produce a monocrystalline SiC layer carrier, removing some or all of the thickness of the silicon oxide film over some region or all of the back side of the support substrate in the monocrystalline SiC layer carrier so as to impart warpage to the monocrystalline SiC layer carrier; depositing polycrystalline SiC onto the monocrystalline SiC layer by chemical vapor deposition so as to form a polycrystalline SiC substrate; and physically and/or chemically removing the support substrate.
[2] The SiC composite substrate production method of [1], wherein the silicon oxide film of the support substrate is a thermal oxide film.
[3] The SiC composite substrate production method of [1] or [2], wherein some or all of the silicon oxide film over all of the back side of the support substrate in the monocrystalline SiC layer carrier is removed by chemical etching.
[4] The SiC composite substrate production method of any one of [1] to [3], wherein the monocrystalline SiC layer is provided by transferring onto the support substrate a monocrystalline SiC thin film exfoliated from a monocrystalline SiC substrate by ion-implantation exfoliation.
[5] The SiC composite substrate production method of any one of [1] to [3], wherein the monocrystalline SiC layer is provided by heteroepitaxial growth of SiC on the support substrate.
[6] The SiC composite substrate production method of any one of [1] to [5], wherein the SiC composite substrate has an amount of bow that is set within the range of −50 μm to +50 μm.

Advantageous Effects of Invention

This invention, by removing some or all of the thickness of the silicon oxide film over some region or all of the back side of the support substrate in a monocrystalline SiC layer carrier so as to impart warpage to the monocrystalline SiC layer carrier, and then depositing polycrystalline SiC thereon to form a polycrystalline SiC substrate, is able to cancel out warpage due to stress (thermal stress and internal stress) caused by the polycrystalline SiC substrate with the warpage imparted to the monocrystalline SiC layer carrier, thus enabling the production of SiC composite substrates of excellent shape.

DESCRIPTION OF EMBODIMENTS

Figure 1:
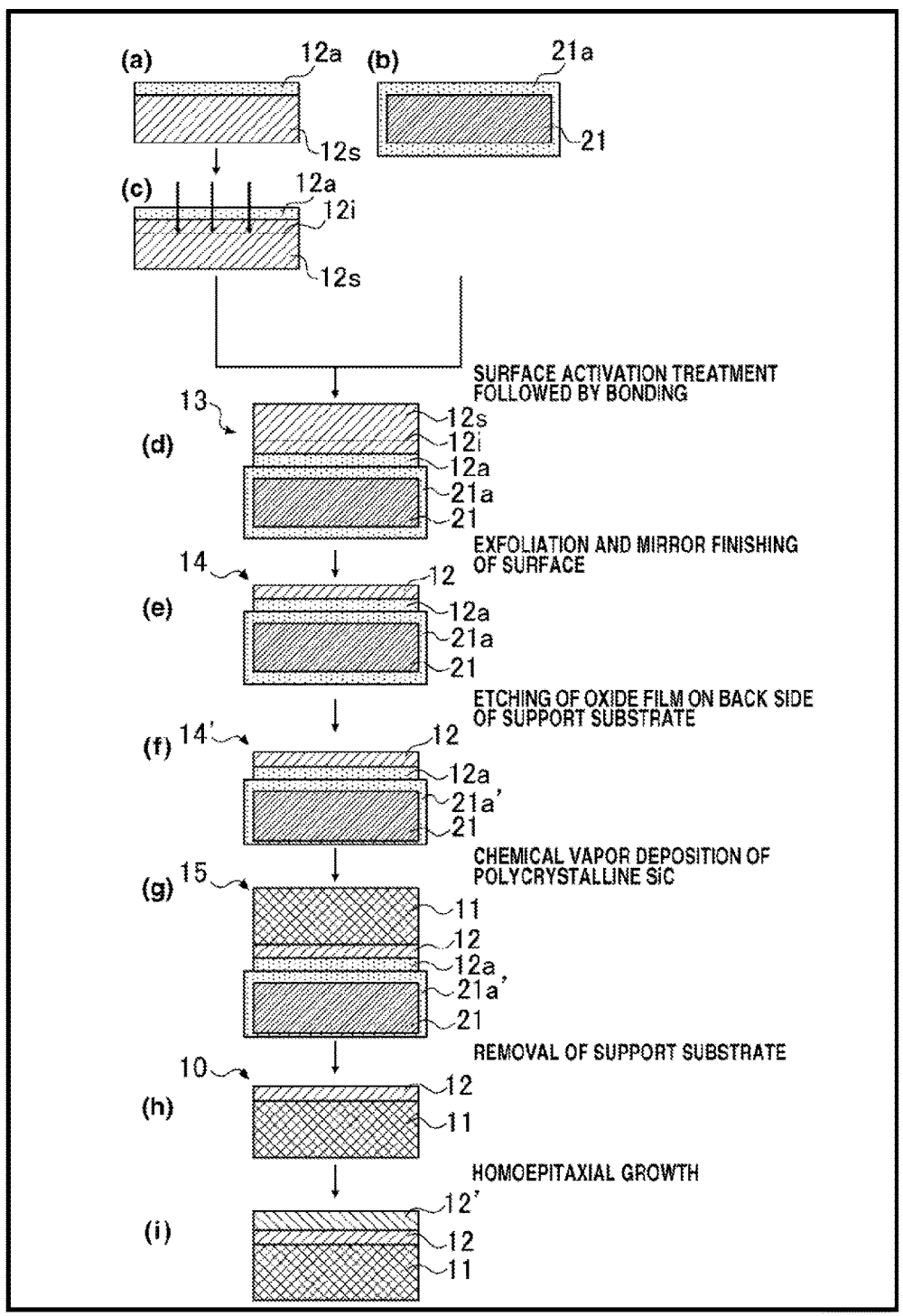
FIG. 1 is a diagram showing production steps in an embodiment of the SiC composite substrate production method of the invention.

The inventors have carried out the following investigations in order to resolve the above problems. That is, because it is generally possible to epitaxially grow a SiC layer, it is not a problem for the high-quality monocrystalline SiC layer serving as the seed to be thin. One would therefore think that costs could be greatly lowered by exfoliating a thin film from a bulk wafer of monocrystalline SiC and transferring it to an underlying support wafer. However, because device processes using conventional SiC substrates reach temperatures of 1,800° C., the support wafer must be made of a material which can withstand such elevated temperatures and for which, moreover, metal contamination is not a concern. In light of this, it appears to be most appropriate for the support wafer to be a substrate made of polycrystalline SiC. In this case, given that both the thin film and the support wafer are made of SiC, problems such as warping and cracking caused by a difference in thermal expansion coefficients are also avoidable. Here a bonding process is conceivable as the method for stacking the monocrystalline SiC thin film and the polycrystalline SiC substrate, although bonding requires atomic-order (angstrom-order) smoothing of the polycrystalline SiC substrate surface. However, in polycrystalline SiC substrates, the crystal grain boundaries (gram boundaries) and crystal orientations are randomly arranged, making atomic-level smoothing extremely difficult. The inventors have thus devised the following method for producing SiC composite substrates.

This production method is a method for producing a SiC composite substrate having a monocrystalline SiC layer on a polycrystalline SiC substrate, and is characterized by providing a monocrystalline SiC layer on one side of a support substrate made of silicon so as to produce a monocrystalline SiC layer carrier, subsequently depositing polycrystalline SiC on the monocrystalline SiC layer by chemical vapor deposition so as to produce a SiC laminate made up of a monocrystalline SiC layer and a polycrystalline SiC substrate stacked on a support substrate, and then physically and/or chemically removing the support substrate.

Here, because a substrate made of silicone (Si) has mechanical strength and physical and/or chemical removal (i.e., grinding or chemical etching) thereof is easy to carry out, it is suitable for use as the support substrate in the inventive production method. The support substrate may be either a polycrystalline silicon wafer or a monocrystalline silicon wafer. In cases where a monocrystalline silicon wafer is used as the support substrate, the availability of high-quality large-diameter substrates at low cost enables production costs for SiC composite substrates to be reduced as well. Alternatively, it is also possible to heteroepitaxially grow monocrystalline cubic SiC on a monocrystalline Si wafer. This obviates the need for monocrystalline SiC substrate bonding, and exfoliation steps, making it possible to produce large-diameter SiC composite substrates at a lower cost than commercially available bulk SiC wafers.

With this method for producing SiC composite substrates, the support substrate is not a difficult-to-work AlN substrate, but an easy-to-work Si substrate, and so machining and chemical treatment can be carried out with great ease. Therefore, the support substrate can easily be removed by simple and convenient grinding, or polishing, or by inexpensive chemical etching treatment with KOH, HF or the like, eliminating the need to reclaim/recycle the troublesome and high-cost AlN as in Patent Document 1 and making it possible to produce high-quality SiC composite substrates at low cost.

However, because a support substrate made of silicon has a coefficient of thermal expansion which differs from that of a monocrystalline SiC layer or a polycrystalline SiC substrate (specifically, SiC has a higher thermal expansion coefficient than Si), and moreover because internal stress tends to build up in a polycrystalline SiC substrate for formed by chemical vapor deposition, warpage readily arises in a support substrate-containing laminate (specifically, when returning the laminate to room temperature, the center portion of the substrate in the SiC laminate has a tendency to become downwardly convex). When such warpage arises in the course of production and is left uncorrected, the shape of the SiC composite substrate ends up reflecting the warpage, and so a planar substrate is not obtained. When the SiC composite substrate lacks planarity, not only is it difficult to handle the SiC composite substrate in subsequent steps, fabricating precise, fine-featured devices becomes more difficult. For example, the use of photolithographic processes in device production becomes difficult, hampering commercialization of the SiC composite substrate.

The inventors have conducted various investigations on this problem of warpage, whereupon they have come to understand that, in the course of producing an SiC composite substrate, when polycrystalline SiC is deposited onto a monocrystalline SiC layer carrier, there arises thermal stress caused by the difference in thermal expansion coefficients between the monocrystalline SiC layer carrier (wherein a monocrystalline SiC layer is carried on a support substrate made of silicon) and the polycrystalline SiC and internal stress originating from the chemical vapor deposited film, leading to the appearance of warpage in the SiC composite substrate. Moreover, upon further investigation, they have discovered that when warpage is imparted to the monocrystalline SiC layer carrier, by suitably releasing the stress that arises during deposition of the polycrystalline SiC and depositing the polycrystalline SiC to a thickness capable of withstanding this stress, a SiC composite substrate that is substantially free of warpage can be obtained. The inventors have conducted even further intensive investigations based on this finding and have improved the above-devised SiC composite substrate production method by adding specific steps thereto, ultimately arriving at the present invention.

That is the inventive method for producing SiC composite substrates is a method for producing a SiC composite substrate having a monocrystalline SiC layer on a polycrystalline SiC substrate, which method is characterized by including the steps of, in order: providing a monocrystalline SiC layer on the front side of a support substrate that is made of silicon and has a silicon oxide film on front and back sides thereof so as to produce a monocrystalline SiC layer carrier; removing some or all of the thickness of the silicon oxide film over some region or all of the back surface of the support substrate in the monocrystalline SiC layer carrier so as to impart warpage to the monocrystalline SiC layer carrier; depositing polycrystalline SiC onto the monocrystalline SiC layer by chemical vapor deposition so as to form a polycrystalline SiC substrate; and physically and/or chemically removing the support substrate.

The silicon oxide film of the support substrate is preferably a thermal oxide film. The thickness of this silicon oxide film should be of a degree that allows warpage of the monocrystalline SiC layer carrier to be adjusted.

Some or all of the thickness of the silicon oxide film over all of the back side of the support substrate in the monocrystalline SiC layer carrier may be removed by chemical etching. It is preferable to suitably adjust the amount of the silicon oxide film that is removed (amount of decrease in thickness) to such a degree as to cancel out internal stress within the polycrystalline SiC substrate and warpage of the SiC laminate. In this case, the amount of bow in the SiC composite substrate may be adjusted within the range of −50 µm to ±50 µm. At an amount of bow in the SiC composite substrate 10 within this range, the SiC composite substrate 10 can be clamped without difficulty by a vacuum chuck or an electrostatic chuck in the manufacturing equipment during the semiconductor device fabrication process.

It is preferable to provide a thin film made of silicon oxide, silicon nitride or silicon oxynitride (also referred to as an intervening film) between the support substrate having a silicon oxide film and the monocrystalline SiC layer. This thin film not only strongly bonds the monocrystalline SiC layer to the support substrate, it can also be made to function as an etch stopping layer when, after most of the support substrate made of silicon has been removed by grinding or the like, removing what remains of the support substrate by chemical etching. Also, by carrying out chemical etching treatment in such a way that the etchant such as HF comes into direct contact with the entire surface of the intermediate layer during removal of the support substrate, the intermediate layer can easily and uniformly be completely removed. As a result, the surface of the monocrystalline SiC layer is obtained in a very smooth and clean state.

Also, in this SiC composite substrate production method, it is preferable to transfer onto the support substrate and thereby provide a monocrystalline SiC thin film that has been exfoliated from a monocrystalline SiC substrate by an ion implantation process. Alternatively, the monocrystalline SiC thin film may be provided on the support substrate by the heteroepitaxial growth SiC. In this way, by a single ion implantation exfoliation treatment or by heteroepitaxial growth, there can be obtained a monocrystalline SiC layer which has the minimum required film thickness and determines the characteristics of the SiC composite substrate, thus enabling a SiC composite substrate of excellent characteristics to be economically produced.

It is preferable for chemical vapor deposition (CVD), and more preferable for thermal CVD, to be used as the means of forming the polycrystalline SiC substrate. Because polycrystalline SiC is deposited and formed on the monocrystalline SiC layer, unlike in the prior art, there is no need for a highly planarizing operation that relies on grinding, polishing, CMP or the like of the hard-to-machine material SiC.

As noted above, before depositing polycrystalline SiC on the monocrystalline SiC layer, by removing some or all of the thickness of the silicon oxide film over some region or all of the back side of the support substrate in the monocrystalline SiC layer carrier (i.e., the side opposite from that supporting the monocrystalline SiC layer) and thereby imparting warpage to the monocrystalline SiC layer carrier (e.g., warpage oriented such that the center portion of the substrate becomes upwardly convex), because this warpage is oriented in the opposite direction from warpage due to the polycrystalline SiC substrate that is subsequently formed (e.g., warpage oriented such that the center portion of the substrate becomes downwardly convex), the warpage of the monocrystalline SiC layer carrier and the warpage due to stresses originating from the polycrystalline SiC substrate (thermal stress, and internal stress) cancel out each other, enabling the easy and convenient production of high-quality SiC composite substrates having little warpage.

An embodiment of the inventive method for producing SiC composite substrates is described below while referring to FIG. 1.

(Step 1)

First, a monocrystalline SiC substrate 12s which is to be bonded to the support substrate 21 is provided. The monocrystalline SiC substrate 12s is preferably selected from among ones having a crystal structure that is 4H—SiC, 6H—SiC or 3C—SiC. The size of the monocrystalline SiC substrate 12s and the subsequently described support substrate 21 is set according to such factors as the size required for semiconductor element fabrication or gallium nitride, diamond and nanocarbon film growth, and the cost. Also, a monocrystalline SiC substrate 12s having a thickness in the vicinity of the substrate thickness specified in the SEMI standards or the JEIDA standards is preferable in terms of handleability. The monocrystalline SiC substrate 12s used here may be a commercially available product, such as a monocrystalline SiC wafer that is sold commercially for use in power devices. The use of one whose surface has been finish polished by chemical mechanical polishing (or planarization) and has a flat and smooth surface is preferred.

It is preferable to form a specific thin film 12a at least the front side of the monocrystalline SiC substrate 12s that is to be bonded to the support substrate 21 (FIG. 1A). The thin film 12a should be a dielectric film, such as a silicon oxide film, silicon nitride film or silicon oxynitride film, having a thickness of from about 50 nm to about 600 nm. Not only does this thin film 12a facilitate bonding with the support substrate 21, it also has the effect of suppressing the channeling of implanted ions in the ion implantation treatment that is carried out thereafter. The thin film 12a may be provided following the subsequently described ion implantation treatment.

Any method may be used to form the thin film 12a, provided it is a film-forming method capable of forming the thin film 12a so that it adheres well to the monocrystalline SiC substrate 12s. For example, a silicon oxide film may be formed by PECVD or thermal oxidation; a silicon nitride film or a silicon oxynitride film may be formed by sputtering.

(Step 2)

Next, a support substrate 21 made of silicon is provided. Use should be made of, for example, a polycrystalline Si wafer or a monocrystalline Si wafer.

A silicon oxide film 21a is formed on both the front and back sides of the support substrate 21 (FIG. 1B).

It is preferable here for the silicon oxide film on the support substrate to be a thermal oxide film. The silicon oxide film has the same thickness on both the front and back sides, the thickness being of a degree that enables warpage of the monocrystalline SiC film carrier to be adjusted by removal of the silicon oxide film. For example, a thickness of from 500 to 2,000 nm is preferred.

(Step 3)

Next, an ion implant region 12i is formed by implanting hydrogen ions or the like into the thin film 12a-forming side of the monocrystalline SiC substrate 12s (FIG. 1C).

Here, during ion implantation into the monocrystalline SiC substrate 12s, a predetermined dose of at least hydrogen ions ($H^+$) or molecular hydrogen ions ($H_2^+$) is introduced at an implantation energy that enables the formation of an ion implant region 12i to the desired depth from the surface thereof. With regard to the conditions at this time, the ion implantation energy should be set so as to obtain a thin film of the desired thickness. Helium ions, boron ions and the like may be implanted at the same time; any ions that can obtain the same effect may be used.

The dose of hydrogen ions ($H^+$) implanted to the monocrystalline SiC substrate 12s is preferably from $1.0 \times 10^{16}$ atoms/cm$^2$ to $9.0 \times 10^{17}$ atom/cm$^2$. At less than $1.0 \times 10^{16}$ atoms/cm$^2$, embrittlement of the interface may not occur. On the other hand, at more than $9.0 \times 10^{13}$ atoms/cm$^2$, bubbles sometimes form during heat treatment after bonding, resulting in transfer defects.

When molecular hydrogen ions ($H_2^+$) are used as the implanted ions, the dose thereof is preferably from $5.0 \times 10^{15}$ atoms/cm$^2$ to $4.5 \times 10^{17}$ atoms/cm$^2$. At less than $5.0 \times 10^{15}$ atoms/cm$^2$, embodiment of the interface may not occur, whereas at more than $4.5 \times 10^{17}$ atoms/cm$^2$, bubbles sometimes form during heat treatment after bonding, resulting in transfer defects.

The depth to the ion implant region 12i from the ion-implanted substrate surface (i.e. the ion implantation depth) corresponds to the desired thickness of the monocrystalline SiC thin film to be provided on the support substrate 21. This is generally from 100 to 2,000 nm, preferably from 300 to 500 nm, and more preferably about 400 nm. It is desirable for the ion implant region 12i (i.e., the ion distribution thickness) to have a thickness which readily enables exfoliation by means of mechanical impact or the like; the thickness is preferably from 200 to 400 nm, and more preferably about 300 nm.

(Step 4)

Next, the side of the monocrystalline SiC substrate 12s on which the thin film 12a has been formed and the front side of the support substrate 21 on which the silicon oxide film 21a has been formed are bonded together by mutually surface activation-treating the surfaces. Plasma activation treatment, vacuum ion beam treatment or immersion treatment in ozone water may be carried out as the surface activation treatment.

Of these, when plasma activation treatment is carried out, the monocrystalline SiC substrate 12s and/or support substrate 21 on which treatment up to Step 3 above has been completed are loaded into a vacuum chamber and a plasma-generating gas is introduced into the chamber at reduced pressure, following which the substrates are exposed for about 5 to 10 seconds to high-frequency plasma at about 100 W thereby plasma-activating the surface. Oxygen gas, hydrogen gas, nitrogen gas, argon gas, a mixed gas thereof or a mixed gas of hydrogen gas and helium gas may be used as the plasma-generating gas.

In the case of vacuum ion-beam treatment, activation treatment is carried out by loading the monocrystalline SiC substrate 12s and/or the support substrate 21 into a high-vacuum chamber, and directing an ion beam of argon or the like at the surfaces to be bonded.

In the case of immersion treatment in ozone water, the monocrystalline SiC substrate 12s and/or the support substrate 21 are immersed in ozone water (water in which ozone gas has been dissolved), thereby activating the surfaces.

These surface activation treatments may be carried out only on the monocrystalline SiC substrate 12s or only on the support substrate 21 although such treatment is preferably carried out on both the monocrystalline SiC substrate 12s and the support substrate 21.

Surface activation treatment may be earned out by any one of the above methods or by a combination thereof. The sides of the monocrystalline SiC substrate 12s and the support substrate 21 where surface activation treatment is carried out are those sides on the respective substrates where bonding is to be carried out, i.e., the thin film 12a surface and the front side of the support substrate 21 where the silicon oxide film 21a has been formed.

These surfaces of the monocrystalline SiC substrate 12s and the support substrate 21 that have been surface activation treated (i.e., the thin film 12a surface and the silicon oxide film 21a surface on the front side of the support substrate 21) are then bonded together as the bowling surfaces.

After bonding together the monocrystalline SiC substrate 12s and the support substrate 21, heat treatment may be carried out at preferably between 150 and 350° C. and more preferably between 150 and 250° C., so as to increase the bond strength at the bonding interface between the thin film 12a and the silicon oxide film 21a. Because substrate warpage arises at this time due to the difference between the thermal expansion coefficients for the monocrystalline SiC substrate 12s and the support substrate 21, it is desirable to minimize warpage by using a temperature suitable to the respective materials thereof. Although the heat treatment time depends to some degree on the temperature as well, a period of from 2 to 24 hours is preferred.

In this way, the thin film 12a and the silicon oxide film 21a mutually adhere and function as an intervening layer 13. The monocrystalline SiC substrate 12s and the support substrate 21 strongly adhere to one another through this intervening layer, forming a bonded substrate 13 (Step 1D).
(Step 5)

With regard to the bonded substrate 13, a monocrystalline SiC thin film that has exfoliated from the monocrystalline SiC substrate 12s at the ion implant region 12i with the application of thermal energy or mechanical energy to the ion-implanted portion is transferred onto the support substrate 21.

At this time, because the thin film 12a and the silicon oxide film 21a firmly adhere to one another, and moreover because the thin film 12a and the silicon oxide film 21a firmly adhere to, respectively, the monocrystalline SiC substrate 12s and the support substrate 21, exfoliation does not arise in places other than the area of exfoliation at the ion implant region 12i.

The exfoliation method used may be, for example, a thermal exfoliation process that involves heating the bonded substrate 13 to an elevated temperature, which heat generates tiny bubbles of the ion-implanted constituent within the ion implant region 12, causing exfoliation to arise and thereby separating off a monocrystalline SiC substrate 12s. Alternatively, use may be made of a mechanical exfoliation process in which, while carrying out low-temperature heat treatment of a degree that does not induce thermal exfoliation (e.g., between 500 and 900° C., and preferably between 500 and 700° C.), a physical impact is applied to one end of the ion implant region 12i, inducing mechanical exfoliation and thereby separating off a monocrystalline SiC substrate 12s. Mechanical exfoliation is more preferable because the transfer surface following monocrystalline SiC thin film transfer has a relatively low roughness compared with the surface obtained by thermal exfoliation.

Following exfoliation treatment, heat treatment to improve adhesion between the monocrystalline SiC thin film and the support substrate 21 may be carried out by heating the monocrystalline SiC thin film carrier at a temperature between 700 and 1,000° C. that is higher than the temperature dining exfoliation treatment, for a heating time of from 1 to 24 hours.

The monocrystalline SiC thin film surface on the support substrate 21 is mirror finished to give monocrystalline SiC layer 12, thereby obtaining a monocrystalline SiC layer carrier 14 (FIG. 1E). Specifically, the monocrystalline SiC thin film is subjected to chemical mechanical polishing (CMP), thereby removing the damage layer owing to ion implantation and also mirror-polishing the surface. This may be carried out by a known CMP polishing process used for planarizing silicon wafers.

The monocrystalline SiC layer 12 is a thin film made of monocrystalline SiC having a thickness of not more than 5 μm, preferably not more than 2 μm, more preferably at least 100 nm and not more than 1 μm, even more preferably at least 200 nm and not more than 800 nm, and most preferably at least 300 nm and not more than 500 nm. At a monocrystalline SiC layer thickness of 5 μm or less, even factoring in the cost of rendering this into a composite substrate, this is economically more advantageous than using a pure monocrystalline SiC substrate.

The monocrystalline SiC substrate 12s following exfoliation, by again subjecting the surface to polishing, cleaning and the like, can be re-used as a substrate for bonding in the same method for producing a monocrystalline SiC layer carrier 14.
(Step 6)

Next, some or all of the thickness of the silicon oxide film 21a over some region or all of the side of the support substrate 21 in monocrystalline SiC layer carrier 14 opposite from that supporting the monocrystalline SiC layer (the opposite side here being the back, or downward facing, side of the support substrate 21 in the diagram) is removed, thereby imparting warpage to the monocrystalline SiC layer carrier 14' (FIG. 1F). In the diagram 14' is the monocrystalline SiC layer carrier following removal of the silicon oxide film 21a, and 21a' is the silicon oxide film following removal.

Here, removal of the silicon oxide film 21a may be carried out by either a Physical method or a chemical method, so long as it is a method capable of removing a uniform thickness of the silicon oxide film 21a. For example, some or of the thickness of the silicon oxide film 21a over the entire back side of the support substrate 21 in the monocrystalline SiC layer carrier 14 may be removed by chemical etching. It is preferable to suitably adjust the amount of removal of this silicon oxide film 21a (amount of decrease in thickness) according to internal stress within the polycrystalline SiC substrate 11 and the degree of warpage by the SiC laminate to a degree that cancels these out. In this case, the amount of bow in the SiC composite substrate is preferably adjusted to between −50 μm and +50 μm, more preferably between −30 μm and +50 μm, and even more preferably between 0 μm and +30 μm.

Removal of the silicon oxide film 21a may be carried out over the entire back side of the support substrate 21 or, depending on the morphology or degree of warpage in the SiC composite substrate 10, may be carried out on only some region at a specific position on the back side of the support substrate 21.

As a result, the monocrystalline SiC layer carrier 14' warps somewhat convexly in the opposite direction to warpage due to thermal stress and internal stress on account of the subsequently described polycrystalline SiC substrate 11 (for example, the center portion of the substrate warps convexly toward the monocrystalline SiC layer 12 side (top side)).

(Step 7)

Next, using the resulting monocrystalline SiC layer carrier 14', polycrystalline SiC is deposited onto the monocrystalline SiC layer 12 by chemical vapor deposition to form polycrystalline SiC substrate 11, thereby giving a SiC laminate 15 (FIG. 1G). The SiC laminate 15 here is constructed of a silicon oxide film 21a', a thin film 12a, a monocrystalline SiC layer 12 and a polycrystalline SiC substrate 11 stacked in this order on a support substrate 21.

Thermal CVD is preferably used here as the chemical vapor deposition process. The thermal CVD conditions may be conditions commonly used in film formation by the deposition of polycrystalline SiC.

The polycrystalline SiC substrate 11 has a thickness of preferably from 200 to 600 μm, and more preferably from 300 to 500 μm. The function as a support substrate is easily achieved by setting the thickness to at least 200 μm, and the costs can be held down by setting the thickness to not more than 600 μm.

The polycrystalline SiC of the polycrystalline SiC substrate 11 is preferably cubic (3C—SiC). The resistivity may be adjusted by introducing impurities into the polycrystalline SiC substrate 11. In this way, suitable use as a substrate for a vertical power semiconductor device is possible.

When returning the SiC laminate 15 to room temperature following formation of the polycrystalline SiC substrate 11, on account of thermal stress from the polycrystalline SiC substrate 11 that arises because SiC has a higher coefficient of thermal expansion than Si or internal stress that arises in the polycrystalline SiC substrate 11 as a vapor deposited film, the SiC laminate 15 tries to assume a shape that is downwardly convex at the center portion of the substrate (convex toward the back face of the support substrate 21 in the diagram). However, owing to the warpage (the upwardly convex shape at the center portion of the substrate) imparted beforehand to the monocrystalline SiC layer carrier 14' these stresses are cancelled out, suppressing warpage of the SiC laminate 15 overall.

(Step 8)

Next, the support substrate 21 in the SiC laminate 15 obtained in Step 7 is physically and/or chemically removed to obtain a SiC composite substrate 10 (FIG. 1H). At this time, because the support substrate 21 is made of silicon, it is preferable, for example, to remove most of the support substrate 21 by machining, and then selectively remove the remaining support substrate 21, silicon oxide film 21a' and thin film 12a by etching with fluoronitric acid.

A SiC composite substrate 10 that is substantially free of warpage can thus be obtained. The polycrystalline SiC substrate 11 at this time is made of the same SiC as the overlying monocrystalline SiC layer 12. Given that the monocrystalline SiC layer 12 and the polycrystalline SiC substrate 11 have substantially the same thermal expansion coefficient, the occurrence of warpage in the SiC composite substrate 10 is suppressed at any temperature.

(Step 9)

Where necessary, a SiC epitaxial layer 12' may be formed on the monocrystalline SiC layer 12 of the SiC composite substrate 10 (FIG. 1I). Hence, even when the monocrystalline SiC layer 12 is too thin for use as the active layer of a power semiconductor device, by forming a SiC epitaxial layer 12' of a given thickness, it is possible to obtain a SiC composite substrate adapted for power semiconductor fabrication.

EXAMPLES

Figure 2:
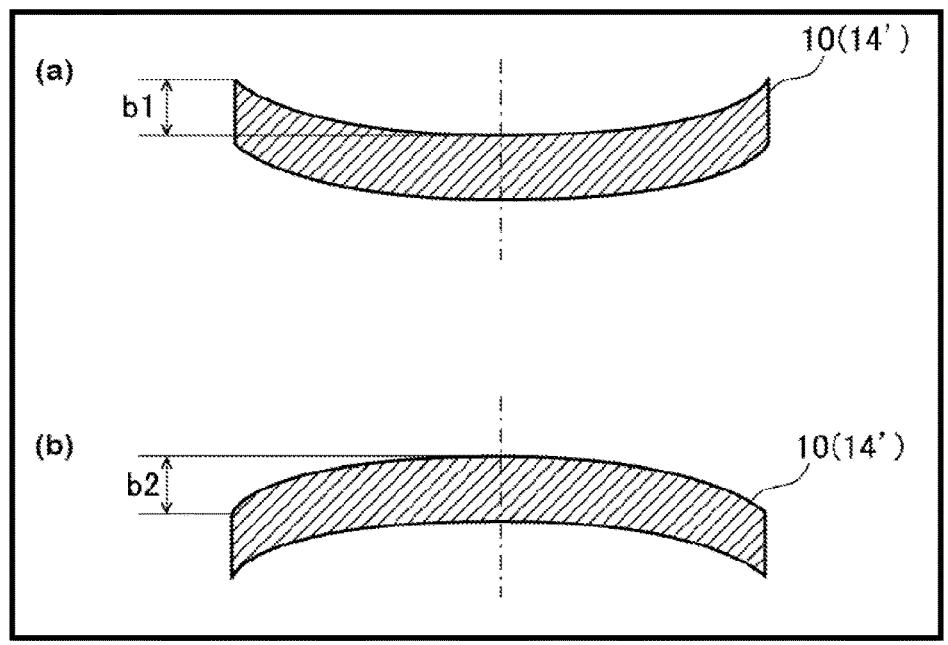
FIG. 2 shows schematic diagrams depicting a method for measuring the amount of bow in a substrate.

The invention is illustrated more fully below by way of a Test Example, although the invention is not limited by the Test Example. Warpage of the substrate was measured as the amount of bow using a normal incidence Fizeau interferometer (Flat Master, from Corning Tropel Corporation). As shown in FIG. 2, the amounts of bow b1 and b2 were measured as the vertical difference between the center and edge portions of the SiC composite substrate 10 or the monocrystalline SiC layer carrier 14'. When the center of the substrate was downwardly convex as shown in FIG. 2A, the vertical difference was treated as a negative value; when upwardly convex as shown in FIG. 2B, the vertical difference was treated as a positive value. Both the SiC composite substrate 10 and the monocrystalline SiC layer carrier 14' were oriented with the monocrystalline SiC layer 12 on the top side (front side) when measuring the warpage.

Test Example 1

In this Test Example, an SiC composite substrate was produced as follows, according to the procedure of the above-described embodiment of the invention.

First, a 3-inch diameter 4H—SiC monocrystalline wafer was provided as the monocrystalline SiC substrate 12s. A silicon oxide film ($SiO_2$ film) having a thickness of 200 nm was formed on one side thereof as the thin film 12a by chemical vapor deposition and polished (FIG. 1A). The side of the wafer having the thin film 12a formed thereon was implanted with $H^+$ ions at an energy of 100 keV and a dose of $8.8 \times 10^{16}$ atoms/cm$^2$ (FIG. 1C).

Separately, a 3-inch diameter monocrystalline Si wafer having a thickness of 400 μm was provided as the support substrate 21, and a silicon oxide film 21a was formed on the front and back sides to a thickness of 1.5 μm by thermal oxidation (FIG. 1B).

Next, the side of the monocrystalline SiC substrate 12s having a silicon oxide film formed thereon and the front side of the support substrate 21 having a silicon oxide film 21a formed thereon were each subjected to plasma activation treatment, after which the sides on both substrates having a silicon oxide film formed thereon were bonded together surface-to-surface, thereby forming a bonded substrate 13 (FIG. 1D).

The bonded substrate 13 was then heat-treated at 750° C. for 12 hours, following which it was returned to room temperature. Making use of the mechanical exfoliation process, a mechanical impact was applied to the ion implant region 12i of the monocrystalline SiC substrate 12s so as to induce exfoliation of a monocrystalline SiC thin film from the monocrystalline SiC substrate 12s, and the thin film was transferred to the support substrate 21. The damage layer was removed from the surface of this monocrystalline SiC thin film, following which the surface was polished, thereby giving a monocrystalline SiC layer carrier 14 in which a 4H—Si monocrystalline SiC layer 12 having a thickness of 600 nm is supported on the support substrate 21 over an intervening silicon oxide film (FIG. 1E). A plurality of such monocrystalline SiC layer carriers 14 were produced under the same conditions.

Next, the entire surface of the silicon oxide film 21a on the back side of the support substrate 21 in this monocrystalline SiC layer carrier 14, i.e., the side opposite from that supporting the monocrystalline SiC layer 12, was immersed in a 10 vol % HF solution and removed by etching (back side oxide film removal). The HF solution immersion time was adjusted so as to vary the amount of removal (amount of reduction in thickness) of the silicon oxide film 21a on the back side of the support substrate 21 to 0 nm (no etching), 200 nm, 400 nm, 600 nm, 800 nm, 1,000 nm, 1,200 nm and 1,400 nm. The amount of removal was determined from the difference in film thickness before and after silicon oxide film 21a removal, as measured by reflectance spectroscopy.

Figure 3:
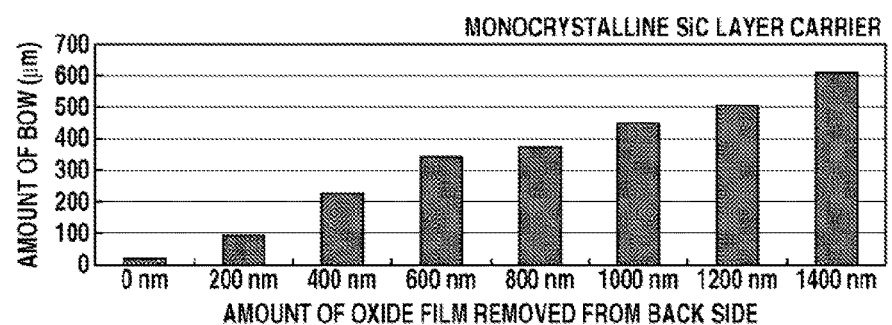
FIG. 3 is a graph showing the relationship between the amount of oxide film removed from the back side of a monocrystalline SiC layer carrier in Test Example 1 and the amount of bow in the monocrystalline SiC layer carrier.

Table 1 and FIG. 3 show the results obtained from measuring the warpage (amount of bow) by the monocrystalline SiC layer carrier 14' at this time. When the amount of removal of silicon oxide film 21a was 0 nm (no etching), the monocrystalline SiC layer carrier 14 was flat with substantially no warpage. The degree of warpage by the monocrystalline SiC layer carrier 14 making the center portion of the substrate therein upwardly convex became larger in proportion with increasing removal of the silicon oxide film 21a.

Next, following removal of this oxide film on the back side, thermal CVD treatment was carried out on the monocrystalline SiC layer 12 of the monocrystalline SiC layer carrier 14' at a temperature of 1,300° C. and a pressure of 17 Pa using silicon tetrachloride and propane as the vapor sources so as to deposit 3C—SiC polycrystalline SiC and form a 300 μm thick polycrystalline SiC substrate 11, thereby producing a SiC laminate 15 (FIG. 1G).

The support substrate 21 of this SiC laminate 15 was then ground away with a fixed whetstone. Specifically, the grit of the whetstone was successively changed in the following order: #1000, #2500, #4000, and grinding was carried out until substantially none of the support substrate 21 remained. Next, the silicon oxide film 21a' and the thin film 12a were removed by etching with an aqueous HF solution, thereby giving a SiC composite substrate 10 having, on a polycrystalline SiC substrate 11, a monocrystalline SiC layer 12 with an ultraclean surface (FIG. 1H).

Figure 4:
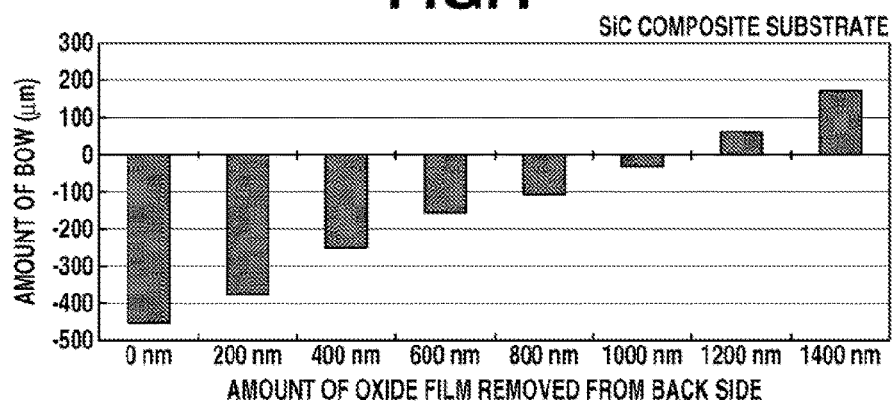
FIG. 4 is a graph showing the relationship between the amount of oxide film removed from the back side of a monocrystalline SiC layer carrier in Test Example 1 and the amount of bow in the SiC composite substrate.

Table 1 and FIG. 4 show the results obtained from measuring the warpage (amount of bow) by the SiC composite substrate 10 at this time. It is apparent that when the amount of removal of SiC film 21a is 0 nm (no etching), the SiC composite substrate 10 is highly warped in a shape where the center portion thereof is downwardly convex (amount of bow, −453 μm). However, such warpage ameliorates in proportion with increasing removal of the silicon oxide film 21a in the monocrystalline SiC layer carrier 14'; the SiC composite substrate 10 was found to attain a flat shape without warpage (amount of bow, 0 μm) when the amount of removal of the silicon oxide film 21a exceeds 1,000 nm.

In this invention, the suitable amount of removal of the silicon oxide film 21a on the back side of the monocrystalline SiC layer carrier 14 cannot be strictly specified because this varies with, for example, the thickness of the polycrystalline SiC substrate 11, the CVD conditions (temperature, etc.) during formation, and the thickness of the support substrate 11. It is thus necessary to set the conditions each time according to the materials and process parameters to be used.

TABLE 1

| Amount of oxide film removed from back side (nm) | Amount of bow (μm) | |
|---|---|---|
| | Monocrystalline SiC layer carrier | SiC composite substrate |
| 0 | 15 | −453 |
| 200 | 91 | −377 |
| 400 | 222 | −250 |
| 600 | 337 | −155 |
| 800 | 366 | −104 |
| 1,000 | 445 | −28 |
| 1,200 | 503 | 61 |
| 1,400 | 610 | 172 |

The invention has been described above by way of the embodiment shown in the diagrams. However, the invention is not limited to the embodiment shown in the diagrams, various modifications such as other embodiments, additions, deletions and substitutions being possible within a range conceivable by those skilled in the art, in so far as all such variations exhibit the operation and advantageous effects of the invention and are encompassed within the scope of the invention.

REFERENCE SIGNS LIST

10 SiC composite substrate
11 Polycrystalline SiC substrate
12 Monocrystalline SiC layer
12a Thin film (intervening layer)
12i Ion implant region
12s Monocrystalline SiC substrate
12' SiC epitaxial layer
13 Bonded substrate
14, 14' Monocrystalline SiC layer carrier
15 SiC laminate
11 Support substrate
21a, 21a' Silicon oxide films

The invention claimed is:

1. A method for producing a SiC composite substrate comprising a monocrystalline SiC layer on a polycrystalline SiC substrate, the method comprising the steps of in order: providing a monocrystalline SiC layer on the front side of a support substrate that is made of silicon and has a silicon oxide film on front and back sides thereof so as to produce a monocrystalline SiC layer carrier; removing some or all of the thickness of the silicon oxide film over some region or all of the back side of the support substrate in the monocrystalline SiC layer carrier so as to impart warpage to the monocrystalline SiC layer carrier; depositing polycrystalline SiC onto the monocrystalline SiC layer by chemical vapor deposition so as to form a polycrystalline Sic substrate; and physically and/or chemically removing the support substrate.

2. The SiC composite substrate production method of claim 1, wherein the silicon oxide film of the support substrate is a thermal oxide film.

3. The SiC composite substrate production method of claim 1, wherein some or all of the silicon oxide film over all of the back side of the support substrate in the monocrystalline SiC layer carrier is removed by chemical etching.

4. The SiC composite substrate production method of claim 1, wherein the monocrystalline SiC layer is provided by transferring onto the support substrate a monocrystalline SiC thin film exfoliated from a monocrystalline SiC: substrate by ion-implantation exfoliation.

5. The SiC composite substrate production method of claim 1, wherein the monocrystalline SiC layer is provided by heteroepitaxial growth of SiC on the support substrate.

6. The SiC composite substrate production method of claim 1, wherein the SiC composite substrate has an amount of bow that is set within the range of −50 μm to +50 μm.

7. The SiC composite substrate production method of claim 2, wherein some or all of the silicon oxide film over all of the back side of the support substrate in the monocrystalline SiC layer carrier is removed by chemical etching.

8. The SiC composite substrate production method of claim 2, wherein the monocrystalline SiC layer is provided by transferring onto the support substrate a monocrystalline SiC thin film exfoliated from a monocrystalline SiC substrate by ion-implantation exfoliation.

9. The SiC composite substrate production method of claim 3, wherein the monocrystalline SiC layer is provided by transferring onto the support substrate a monocrystalline SiC thin film exfoliated from a monocrystalline SiC substrate by ion-implantation exfoliation.

10. The SiC composite substrate production method of claim 2, wherein the monocrystalline SiC layer is provided by heteroepitaxial growth of SiC on the support substrate.

11. The SiC composite substrate production method of claim 3, wherein the monocrystalline SiC layer is provided by heteroepitaxial growth of SiC on the support substrate.

12. The SiC composite substrate production method of claim 2, wherein the SiC composite substrate has an amount of bow that is set within the range of −50 μm to +50 μm.

13. The SiC composite substrate production, method of claim 3, wherein the SiC composite substrate has an amount of bow that is set within the range of −50 μm to +50 μm.

14. The SiC composite substrate production method of claim 4, wherein the SiC composite substrate has an amount of bow that is set within the range of −50 μm to +50 μm.

15. The SiC composite substrate production method of claim 5, wherein the SiC composite substrate has an amount of bow that is set within the range of −50 μm to +50 μm.

* * * * *